(12) United States Patent
Ito

(10) Patent No.: US 9,111,889 B2
(45) Date of Patent: Aug. 18, 2015

(54) DISPLAY DEVICE

(71) Applicant: Japan Display Inc., Tokyo (JP)

(72) Inventor: Masato Ito, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/272,549

(22) Filed: May 8, 2014

(65) Prior Publication Data

US 2014/0332778 A1 Nov. 13, 2014

(30) Foreign Application Priority Data

May 8, 2013 (JP) .................................. 2013-098671

(51) Int. Cl.
*H01L 27/32* (2006.01)

(52) U.S. Cl.
CPC .......... *H01L 27/3258* (2013.01); *H01L 27/322* (2013.01)

(58) Field of Classification Search
CPC ............ H01L 51/0545; H01L 27/3258; H01L 27/322
USPC ............................................ 257/40, E51.018
See application file for complete search history.

(56) References Cited

U.S. PATENT DOCUMENTS

2012/0097994 A1* 4/2012 Yamazaki et al. .............. 257/88

FOREIGN PATENT DOCUMENTS

JP 2006-339028 12/2006
KR 2013-0007421 A 1/2013

OTHER PUBLICATIONS

Office Action issued by Korean Patent Office on May 13, 2015 regarding a counterpart Japanese patent application No. 10-2014-0051290.

* cited by examiner

*Primary Examiner* — Karen Kusumakar
*Assistant Examiner* — Adams S Bowen
(74) *Attorney, Agent, or Firm* — Lowe Hauptman & Ham, LLP

(57) ABSTRACT

A display device includes a thin film transistor substrate including transistors each controlling the amount of light emission of each pixel and a counter substrate arranged to be placed over the thin film transistor substrate. The thin film transistor substrate includes an insulating substrate as a base material, a circuit layer including the transistors formed on the insulating substrate, an organic layer interposed between two electrodes, and an organic insulating layer arranged between the circuit layer and the organic layer and formed of an organic insulating material formed thicker in each pixel region than in an inter-pixel region.

5 Claims, 9 Drawing Sheets

DISPLAY DEVICE

CROSS-REFERENCE TO RELATED APPLICATION

The present application claims priority from Japanese application JP2013-098671 filed on May 8, 2013, the content of which is hereby incorporated by reference into this application.

BACKGROUND OF THE INVENTION

1. Field of the Invention

The present invention relates to a light-emitting element display device, and to a light-emitting element display device that performs display by causing a light-emitting element as a self-luminous body arranged in each pixel to emit light.

2. Description of the Related Art

In recent years, an image display device (hereinafter referred to as an "organic EL (Electro-luminescent) display device") using a self-luminous body called an organic light-emitting diode has been put to practical use. Since a self-luminous body is used, the organic EL display device is superior in term of visibility and response speed compared to a related-art liquid crystal display device, and in addition, a further reduction in thickness is possible in the organic EL display device because an auxiliary lighting device such as a backlight is not necessary.

JP 2006-339028 A discloses that R (red), G (green), and B (blue) color filters are successively formed by patterning on a substrate on which an organic EL element is formed, and also discloses a structure in which a color filter substrate in which color filters are formed pixel by pixel is placed over a thin film transistor (TFT) substrate in which an organic EL element is formed.

SUMMARY OF THE INVENTION

In a light-emitting element display device such as the organic EL display device having the color filter substrate, a light-emitting element can emit only a single color. Therefore, since a mask is not needed in the deposition of a light-emitting layer, the light-emitting element display device has a merit of capable of manufacturing high-resolution pixels. However, since the TFT substrate and the color filter substrate are bonded together with a transparent resin or the like interposed therebetween, a distance is created between the TFT substrate and the color filter substrate, which may cause color mixing due to light leakage from an adjacent pixel.

The invention has been made in view of the circumstances described above, and it is an object of the invention to provide a light-emitting element display device in which color mixing is suppressed.

A display device according to an aspect of the invention includes: a thin film transistor substrate including a plurality of pixels and transistors each controlling the amount of light emission of the pixel; and a counter substrate arranged to be placed over the thin film transistor substrate, wherein each of the plurality of pixels includes a light-emitting region and a non-light-emitting region, and the thin film transistor substrate includes an insulating substrate as a based material, a circuit layer including the transistors formed on the insulating substrate, an organic layer interposed between two electrodes, and a first organic insulating layer between the circuit layer and the organic layer, the first organic insulating layer being thicker in the light-emitting region than in the non-light-emitting region.

In the display device according to the aspect of the invention, one of the two electrodes is a lower electrode formed on the first organic insulating layer while the other electrode is an upper electrode formed on the organic layer, and an edge of the lower electrode is covered with a second organic insulating layer.

In the display device according to the aspect of the invention, a portion of the counter substrate closest to the insulating substrate may be closer to the insulating substrate than the organic layer is. Further, the closest portion may have a light-shielding function.

DETAILED DESCRIPTION OF THE INVENTION

Figure 1:
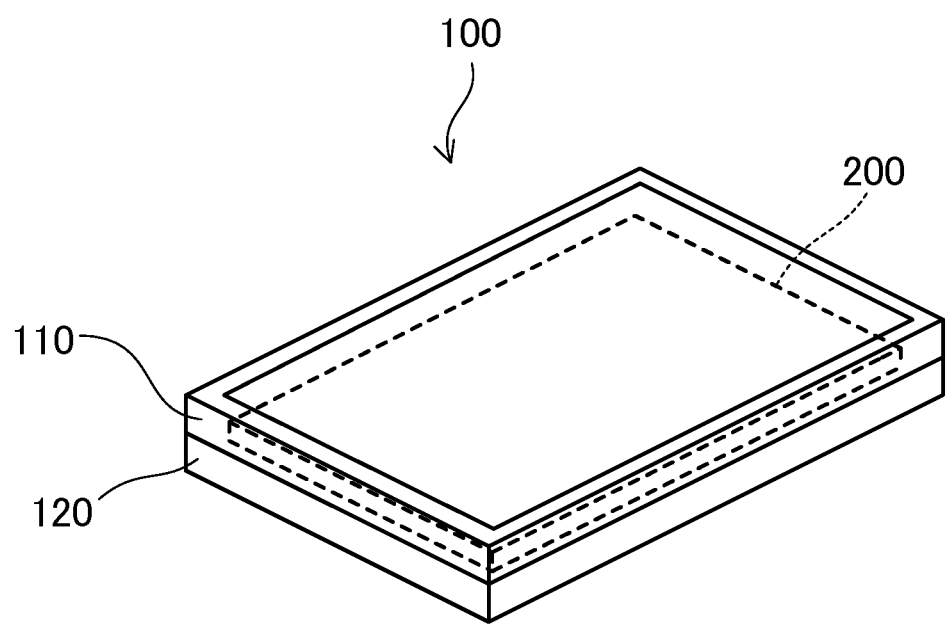
FIG. 1 schematically shows an organic EL display device according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 schematically shows an organic EL display device 100 according to an embodiment of the invention. As shown in the drawing, the organic EL display device 100 includes an organic EL panel 200 fixed so as to be interposed between an upper frame 110 and a lower frame 120.

Figure 2:
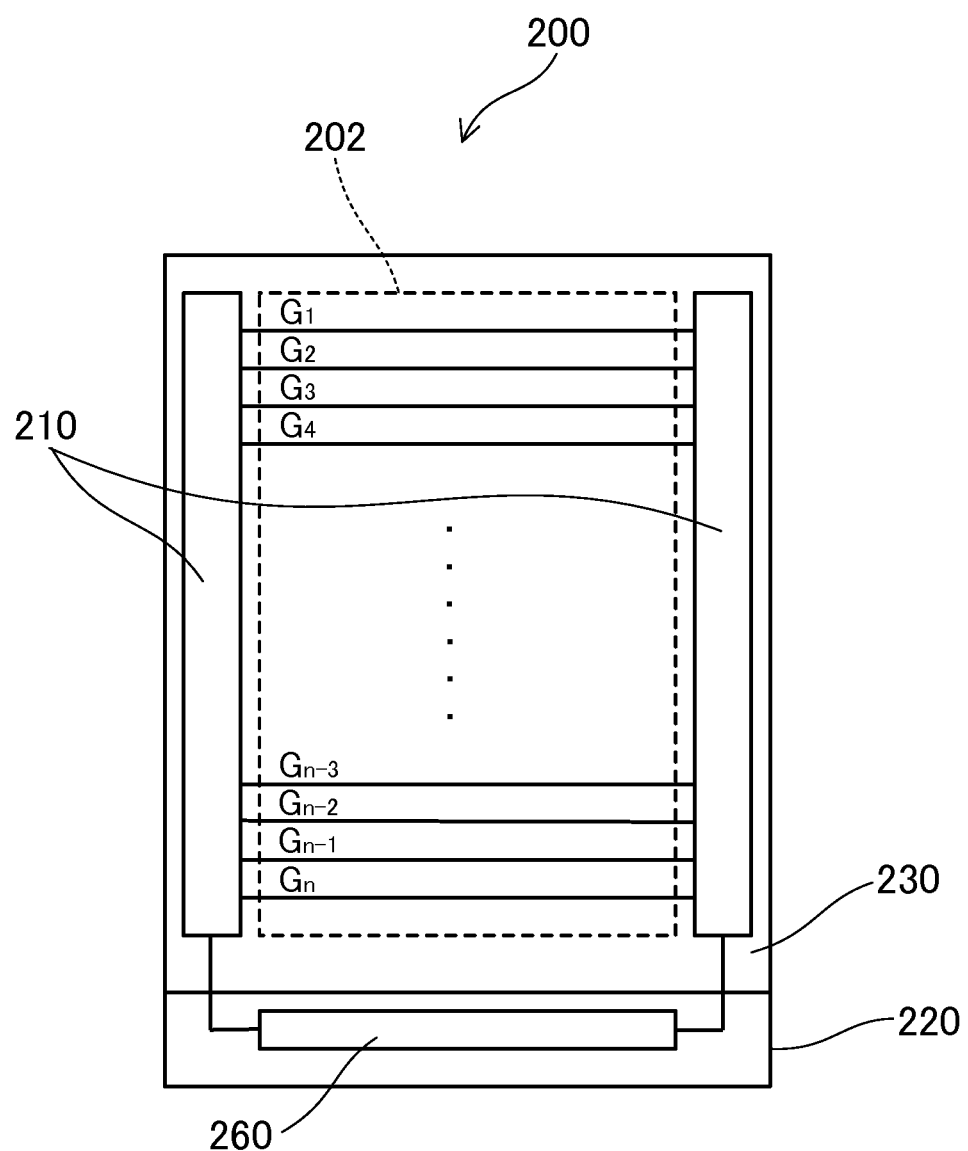
FIG. 2 shows a configuration of an organic EL panel in FIG. 1.

FIG. 2 shows a configuration of the organic EL panel 200 in FIG. 1. The organic EL panel 200 includes two substrates, a TFT (Thin Film Transistor) substrate 220 and a counter substrate 230 arranged to be placed over the TFT substrate 220. A space between these substrates is filled with a transparent resin 229 (described later). The TFT substrate 220 includes a plurality of pixels and thin film transistors formed corresponding to the plurality of pixels. Each of the plurality of pixels includes a light-emitting region and a non-light-emitting region. The TFT substrate 220 includes driver circuits 210 and a driver IC (Integrated Circuit) 260. The driver circuits 210 sequentially apply, to scanning signal lines G1 to Gn, a potential for providing electrical continuity between the source and drain of the TFT of each of the pixels. The driver IC 260 controls the driver circuits 210 and applies a voltage corresponding to the gray-scale value of the pixel to a plurality of data signal lines (not shown) extending so as to perpendicularly intersect the scanning signal lines G1 to Gn in a display region 202.

Figure 3:
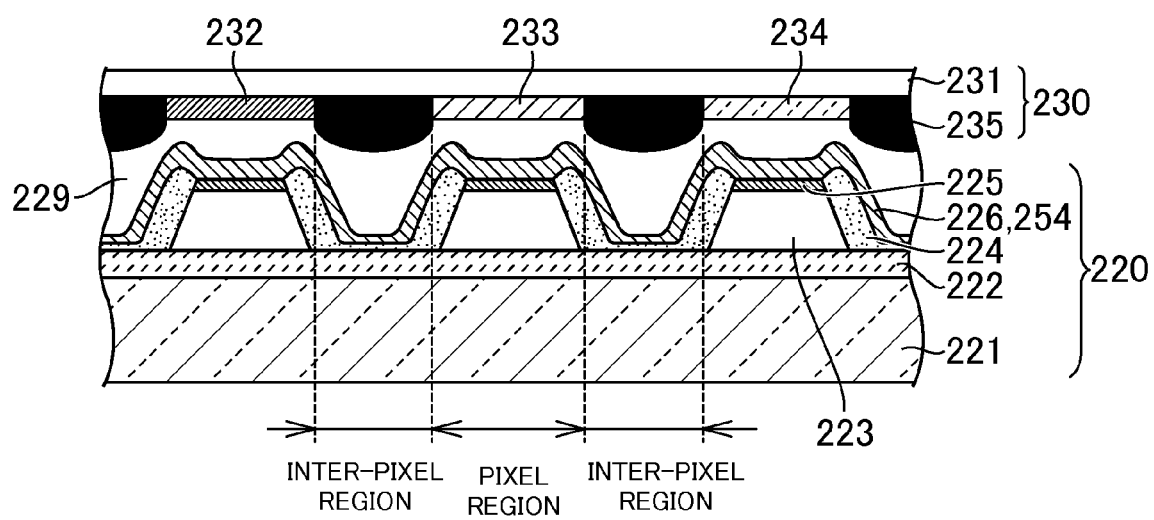
FIG. 3 is a partial cross-sectional view of RGB pixels located in a display region of the organic EL panel.

FIG. 3 is a partial cross-sectional view of RGB pixels located in the display region 202 of the organic EL panel 200. As shown in the drawing, the counter substrate may be a color filter substrate 230 including color filters. The color filter substrate includes an insulating substrate 231 as a glass substrate, a black matrix 235 as a light-shielding film formed so as to partition the pixels on the insulating substrate 231, an R (red) color filter 232, a G (green) color filter 233, and a B (blue) color filter 234. Each region in which the light-shielding film 235 is formed is an inter-pixel region.

The TFT substrate 220 includes an insulating substrate 221, a circuit layer 222, a first organic insulating layer 223, an organic layer 226 interposed between two electrode layers, a lower electrode 225 as one of two electrodes, an upper electrode 254 as the other of the two electrodes, and a second organic insulating layer 224 covering an edge of the lower electrode 225. Each of the pixels includes the light-emitting region and the non-light-emitting region when the display device is viewed from the top. In the light-emitting region, the organic layer including a light-emitting layer is interposed between the lower electrode and the upper electrode, and by flowing current between the two electrodes, the light-emitting region emits light. On the other hand, the non-light-emitting region is arranged to surround the light-emitting region in each of the pixels. Each non-light-emitting region is formed adjacent to a non-light-emitting region of an adjacent pixel.

As the insulating substrate 221, a glass substrate used generally for display devices is preferred, but a resin substrate may also be used. In the circuit layer 222, various signal lines, transistors, and capacitors are formed. An upper surface of the circuit layer has irregularities. In the drawings of the embodiment, the irregularities of the upper surface of the circuit layer 222 are not illustrated for simplifying the drawings. The first organic insulating layer 223 is formed thicker in the light-emitting region than in the non-light-emitting region. Moreover, the first organic insulating layer 223 is formed thicker in a pixel region than in the inter-pixel region. An organic insulating material such as an acrylic resin or polyimide is preferred for the first organic insulating layer 223. With this material, the height of the layer can be easily controlled.

In the organic layer 226, a region interposed between the lower electrode 225 and the upper electrode 254 emits light by flowing current between the electrodes. In the embodiment, light emitted from the organic layer can be white.

The lower electrode 225 is formed of, for example, a transparent conductive material such as ITO (Indium Tin Oxide), and functions as an anode 225. When light is extracted from the counter substrate side, a light reflection film of Ag or the like may be formed below ITO. On the other hand, the upper electrode 254 is composed of a transparent conductive material such as ITO (Indium Tin Oxide) or a film obtained by forming a thin film of Ag to provide a light transmissive property, and functions as a cathode 254. The edge of the anode 225 is covered with the second organic insulating layer. By covering the edge portion of the anode (lower electrode) 225 with the second organic insulating layer, the occurrence of a crack at the edge portion of the organic layer 226 is prevented, so that current leakage between the anode and the cathode can be prevented. The insulating film covering the edge of the lower electrode is referred to generally as a bank. A general bank has a structure in which the upper surface thereof is close to the counter substrate in the inter-pixel region. In contrast to this, the bank of the display device of the invention has a structure in which the upper surface thereof is close to the counter substrate at a portion covering the lower electrode but the bank is away from the counter substrate in the inter-pixel region, that is, the bank is close to the insulating substrate of the TFT substrate.

The first organic insulating layer 223 is arranged on the circuit layer 222, and includes an upper surface that is planarized more than the irregularities of the upper surface of the circuit layer 222. By forming the cathode (upper electrode), the organic layer, and the anode (lower electrode) on the planarized first organic layer, it is possible to form a light-emitting region in which a short circuit between the upper electrode and the lower electrode is prevented.

As described above, the space between the color filter substrate 230 and the TFT substrate 220 is filled with the transparent resin 229. Although the organic insulating layer 223 is not formed in the inter-pixel region in FIG. 3, the organic insulating layer 223 may be formed thinner in the inter-pixel region than in the pixel region as in FIG. 9. Moreover, although the color filter substrate 230 includes the three RGB color filters, the color filter substrate 230 may include RGBW color filters in which a pixel that does not have a color filter and from which W (white) light is output is included. Alternatively, the color filter substrate 230 may include a color filter of another color or color filters through which fewer kinds of color lights are output.

Figure 4:
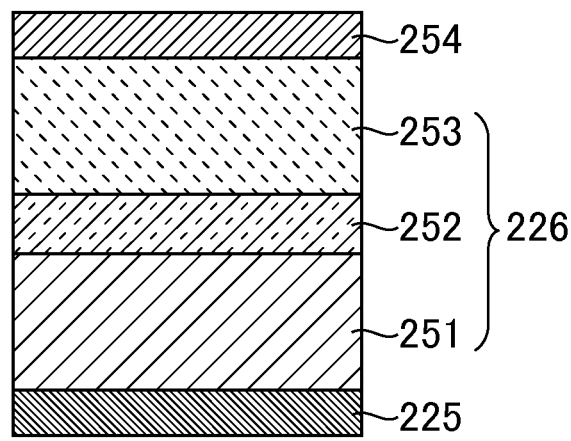
FIG. 4 is a cross-sectional view showing a configuration of a light-emitting layer in FIG. 3.

FIG. 4 is a cross-sectional view showing a configuration of the light-emitting layer 226. As shown in the drawing, the light-emitting layer 226 is interposed between the anode 225 and the cathode 254. By causing a potential difference between the anode 225 and the cathode 254 with the operation of the transistor in the circuit layer 222, the light-emitting layer 226 emits light. The light-emitting layer 226 is composed of a blue light-emitting portion 251, a red-green light-emitting portion 253, and an intermediate layer 252. The blue light-emitting portion 251 emits light in a blue wavelength range. The red-green light-emitting portion 253 emits, in the layer, light in a red wavelength range and light in a green wavelength range, and outputs the red-green light as mixed color light. The intermediate layer 252, which is referred to as a so-called charge generation layer (CGL), is arranged between the blue light-emitting portion 251 and the red-green light-emitting portion 253. With the simultaneous emission of red, green, and blue lights, white-light emission is obtained.

Especially as shown in FIG. 3, since the organic insulating layer 223 is formed thicker in each pixel region than in the inter-pixel region in the embodiment, the light-emitting layer 226 can be close to the color filter substrate 230. Therefore, since most of emitted light is directed to the corresponding color filter, the emitted light can be efficiently utilized.

Moreover, even light that is not directed to the corresponding color filter is prevented more efficiently by the black matrix 235 from entering the color filter of an adjacent pixel. Therefore, it is possible to recue color mixing caused by light output from an adjacent pixel. Further, the organic insulating layer 223 is thinner in the inter-pixel region than in the pixel region. Therefore, even if a foreign substance is mixed when bonding the TFT substrate 220 and the color filter substrate 230 together, the mixing of a foreign substance can be allowed in the inter-pixel region at a portion that is filled with the transparent resin 229 of the inter-pixel region.

Figure 5:
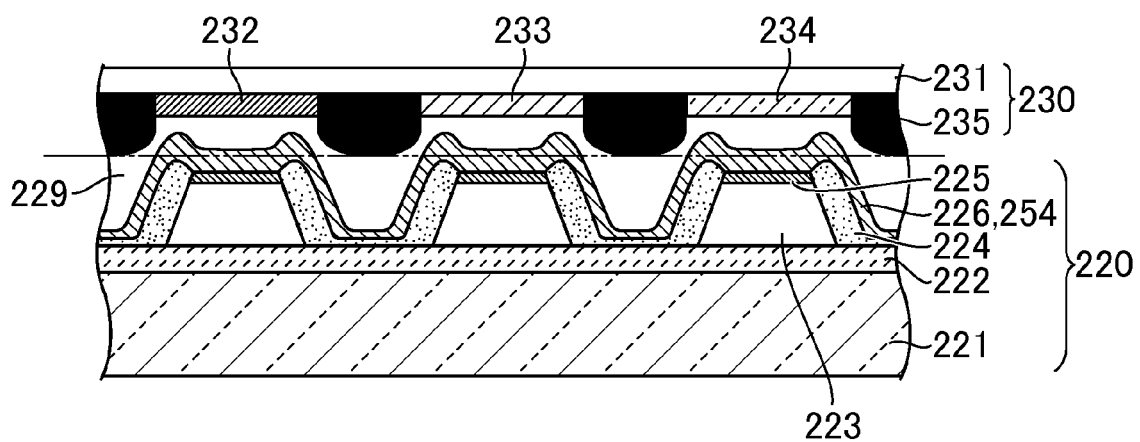
FIG. 5 shows a modified example of the organic EL panel in the same field of view as FIG. 3.

FIG. 5 shows a modified example of the organic EL panel 200 in the same field of view as FIG. 3. The modified example shows the case where the light-emitting layer 226 and the cathode 254 are closer to the color filter substrate 230 side. The top of the black matrix 235 of the color filter substrate 230 on the insulating substrate 221 side is positioned closer to the insulating substrate 221 than the light-emitting layer 226 is. With the arrangement described above, since the light-emitting layer 226 can be closer to the R, G, and B color filters 232, 233, and 234, a greater portion of light emitted from the light-emitting layer 226 can be directed to the corresponding R, G, and B color filters 232, 233, and 234. Even the light that is not directed to the R, G, and B color filters 232, 233, and 234 is blocked by the black matrix 235, so that it is possible to recue color mixing caused by light output from an adjacent pixel. In the modified example, the top of the black matrix 235 is positioned closer to the insulating substrate 221 than the light-emitting layer 226 is. However, without limiting to the black matrix 235, when a portion of the color filter substrate 230 closest to the insulating substrate 221 is positioned closer to the insulating substrate 221 than the light-emitting layer 226 is, a similar advantageous effect can be obtained.

Figure 6:
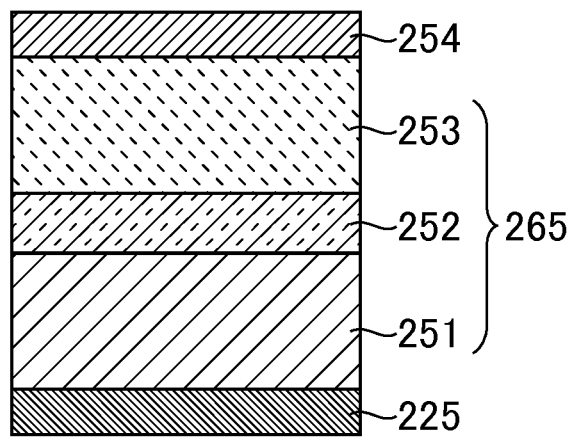
FIG. 6 shows a light-emitting layer as a first modified example of the light-emitting layer in FIG. 4.

FIG. 6 shows a light-emitting layer 265 as a first modified example of the light-emitting layer 226. The light-emitting layer 265 is obtained by replacing the red-green light-emitting portion 253 of the light-emitting layer 226 described above with a yellow light-emitting portion 255 that emits light of a single color of yellow, and the other configurations are the same as those of the light-emitting layer 226.

Figure 7:
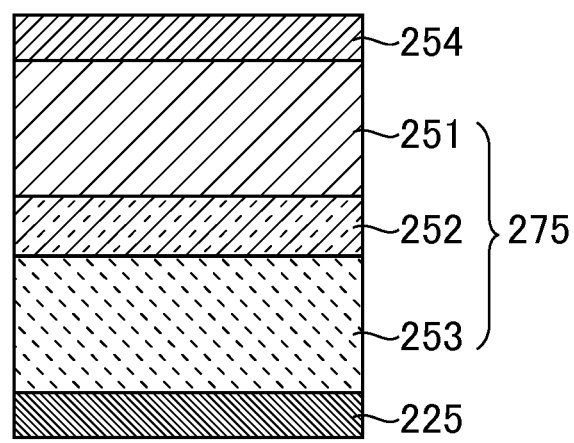
FIG. 7 shows a light-emitting layer as a second modified example of the light-emitting layer in FIG. 4.

FIG. 7 shows a light-emitting layer 275 as a second modified example of the light-emitting layer 226. The light-emitting layer 275 is obtained by changing the order of the red-green light-emitting portion 253 and the blue light-emitting portion 251 of the light-emitting layer 226 described above, and the other configurations are the same as those of the light-emitting layer 226. In this manner, the blue light-emitting portion 251 is located above the red-green light-emitting portion 253, which saves blue light that is absorbed by the red-green light-emitting portion 253. Therefore, the intensity of emission of blue light can be increased.

Figure 8:
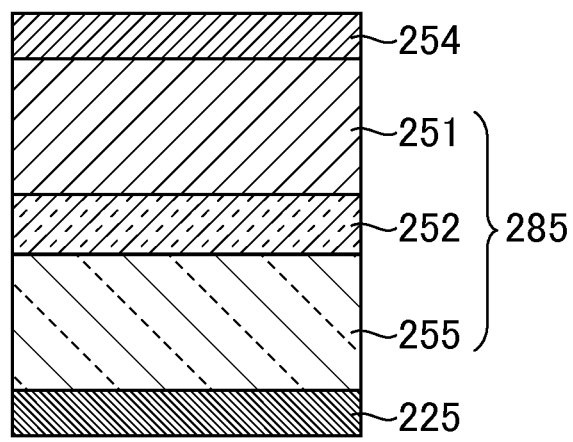
FIG. 8 shows a light-emitting layer as a third modified example of the light-emitting layer in FIG. 4.

FIG. 8 shows a light-emitting layer 285 as a third modified example of the light-emitting layer 226. The light-emitting layer 285 is obtained by changing the order of the red-green light-emitting portion 253 and the blue light-emitting portion 251 of the light-emitting layer 226 described above and further by replacing the red-green light-emitting portion 253 with the yellow light-emitting portion 255 that emits light of a single color of yellow, and the other configurations are the same as those of the light-emitting layer 226. In this manner, the blue light-emitting portion 251 is located above the yellow light-emitting portion 255, which saves blue light that is absorbed by the yellow light-emitting portion 255. Therefore, the intensity of emission of blue light can be increased.

Figure 9:
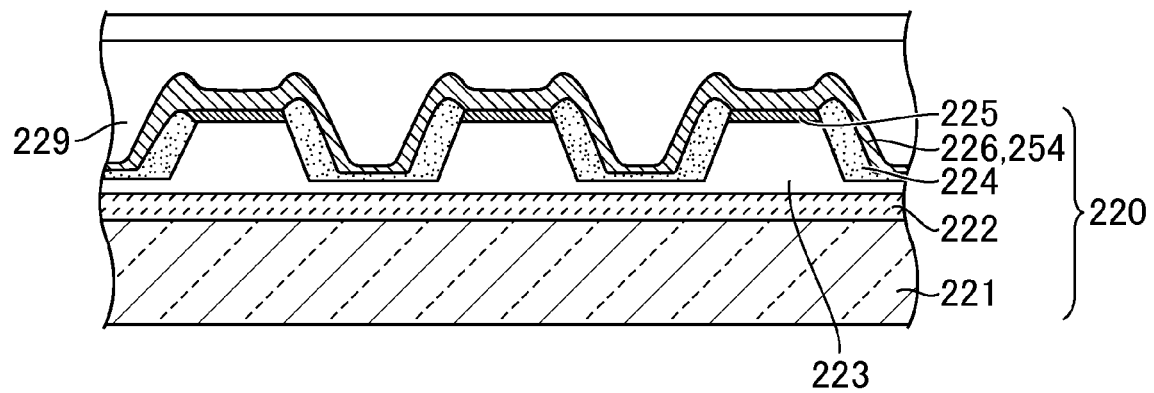
FIG. 9 shows a modified example of the organic EL panel in the same field of view as FIG. 3.

In FIGS. 3 and 5, a case has been shown in which the organic insulating layer 223 is not provided between the pixels. However, as shown in FIG. 9, the organic insulating layer 223 may be formed between the pixels thinner than the organic insulating layer 223 formed in each of the pixels. Moreover, in the embodiment described above, a light-emitting element that is classified into a so-called organic EL element is used for the light-emitting layer. However, other self-luminous elements that emit light by themselves may be used.

What is claimed is:

1. A display device comprising:
   a thin film transistor substrate comprising a plurality of pixels and transistors each controlling the amount of light emission of the pixel; and
   a counter substrate arranged to be placed on the thin film transistor substrate, wherein
   each of the plurality of pixels comprises a light-emitting region and a non-light-emitting region, and
   the thin film transistor substrate comprises
      an insulating substrate as a based material,
      a circuit layer including the transistors formed on the insulating substrate,
      an organic layer which is formed on the circuit layer and is interposed between two electrodes, and
      a first organic insulating layer between the circuit layer and the organic layer,
   wherein
   one of the two electrodes is a lower electrode formed under the organic layer while the other electrode is an upper electrode formed on the organic layer,
   an edge of the lower electrode is covered with the first organic insulating layer,
   the organic layer includes an emitting layer, a first portion connected to each of the two electrodes, and a second portion connected to the upper electrode and the first organic insulating layer, and
   a first distance is shorter than a second distance, wherein the first distance is an average distance between the first portion and the counter substrate, and the second distance is an average distance between a part of the second portion and the counter substrate.

2. The display device according to claim 1, wherein
   the first portion of the organic layer is arranged between a color filter and the insulating substrate in the light-emitting region,
   the second portion of the organic layer is arranged between a black matrix and the insulating substrate in the non-light-emitting region.

3. The display device according to claim 1, wherein
   the first organic insulating layer is isolated in each of the light-emitting regions.

4. A display device comprising:
   a thin film transistor substrate comprising a plurality of pixels and transistors each controlling the amount of light emission of the pixel; and
   a counter substrate arranged to be placed on the thin film transistor substrate, wherein
   each of the plurality of pixels comprises a light-emitting region and a non-light-emitting region, and
   the thin film transistor substrate comprises
      an insulating substrate as a based material,
      a circuit layer including the transistors formed on the insulating substrate,
      an organic layer interposed between two electrodes, and
      a first organic insulating layer between the circuit layer and the organic layer,
   wherein
   a color filter is formed in the counter substrate, and
   a portion of the counter substrate closest to the insulating substrate is closer to the insulating substrate than the organic layer is.

5. The display device according to claim 4, wherein
   the closest portion has a light-shielding function.

* * * * *